US 8,558,603 B2

(12) United States Patent
Hess et al.

(10) Patent No.: US 8,558,603 B2
(45) Date of Patent: Oct. 15, 2013

(54) MULTIPLEXER WITH LEVEL SHIFTER

(75) Inventors: Greg M. Hess, Mountain View, CA (US); Naveen Javarappa, San Jose, CA (US); James E. Burnette, II, San Jose, CA (US)

(73) Assignee: Apple Inc., Cupertino, CA (US)

( * ) Notice: Subject to any disclaimer, the term of this patent is extended or adjusted under 35 U.S.C. 154(b) by 61 days.

(21) Appl. No.: 13/326,932

(22) Filed: Dec. 15, 2011

(65) Prior Publication Data

US 2013/0154712 A1   Jun. 20, 2013

(51) Int. Cl.
*H03L 5/00* (2006.01)
(52) U.S. Cl.
USPC ................................ 327/333; 326/62; 326/81
(58) Field of Classification Search
USPC .................. 326/62–63, 80–82; 327/306, 333
See application file for complete search history.

(56) References Cited

U.S. PATENT DOCUMENTS

| | | | |
|---|---|---|---|
| 6,512,401 B2 * | 1/2003 | Clark et al. | 327/112 |
| 6,667,633 B2 | 12/2003 | Fifield et al. | |
| 6,720,802 B2 * | 4/2004 | Cho | 327/108 |
| 6,768,368 B2 * | 7/2004 | Kaneko et al. | 327/333 |
| 7,570,088 B1 | 8/2009 | Ku et al. | |
| 2009/0259864 A1 | 10/2009 | Li et al. | |

* cited by examiner

*Primary Examiner* — Dinh T. Le
(74) *Attorney, Agent, or Firm* — Erik A. Heter; Meyertons, Hood, Kivlin, Kowert & Goetzel, P.C.

(57) ABSTRACT

A level shifting multiplexer is disclosed. In one embodiment, a multiplexer is coupled to receive a first input signal from circuitry in a first power domain and a second input signal from circuitry in a second power domain. The multiplexer is configured to output a selected one of the first and second input signals to circuitry in the second power domain. The multiplexer also includes a level shifter circuit. When the first input signal is selected, the level shifter circuit may be enabled. When enabled, the level shifter circuit may level shift the first signal such that its voltage swing corresponds to that of the second voltage domain. The multiplexer may also include isolation circuitry configured to inhibit the level shifter.

11 Claims, 4 Drawing Sheets

MULTIPLEXER WITH LEVEL SHIFTER

BACKGROUND

1. Field of the Invention

This invention relates to integrated circuits, and more particularly, to multiplexing and level shifting circuits.

2. Description of the Related Art

Many integrated circuits (ICs) often times incorporate multiple functions onto a single die. For example, a system on a chip (SOC) may incorporate multiple processor cores, one or more memory types, input/output (I/O) units, and graphics units, among other functional units. Due to the large number of signals that may be transferred between such units. In some cases, a given unit may select among signals transferred from one or more other units using multiplexers.

In addition to the large numbers of signals being transferred between the various units of an IC, many functional units operate in different voltage domains. For example, a processor core may operate at a first voltage in a first voltage domain, a memory may operate at a second voltage in a second voltage domain, and so on. Since different functional unit in different voltage domains may need to communicate with one another, level shifting circuits may be utilized in the transfer of signals from one voltage domain to the next.

SUMMARY

A level shifting multiplexer is disclosed. In one embodiment, a multiplexer is coupled to receive a first input signal from circuitry in a first power domain and a second input signal from circuitry in a second power domain. The multiplexer is configured to output a selected one of the first and second input signals to circuitry in the second power domain. The multiplexer also includes a level shifter circuit. When the first input signal is selected, the level shifter circuit may be enabled. When enabled, the level shifter circuit may level shift the first signal such that its voltage swing corresponds to that of the second voltage domain. The multiplexer may also include isolation circuitry configured to inhibit the level shifter.

In one embodiment, an integrated circuit (IC) may include a first functional unit in a first power domain and a second functional unit in a second power domain. Circuitry in the first power domain may operate at a first voltage, which circuitry in the second power domain may operate at a second voltage different from the first voltage. A multiplexer is coupled to receive a first signal from the first functional unit and a second signal from the second functional unit. The multiplexer is further coupled to provide an output signal to a third functional unit in the second power domain. The multiplexer is configured to select the first signal responsive to receiving a selection signal in a first state (e.g., a logic low). If the first signal is selected, a level shifter coupled to the output of the multiplexer is configured to provide an output signal that is effectively a level shifted version of the first input signal. If the second signal is selected, no level shifting is performed, since the functional unit from which the second signal is received, as well as the functional unit to which the output signal is provided, are both in the second power domain.

BRIEF DESCRIPTION OF THE DRAWINGS

The following detailed description makes reference to the accompanying drawings, which are now briefly described.

Figure 1:
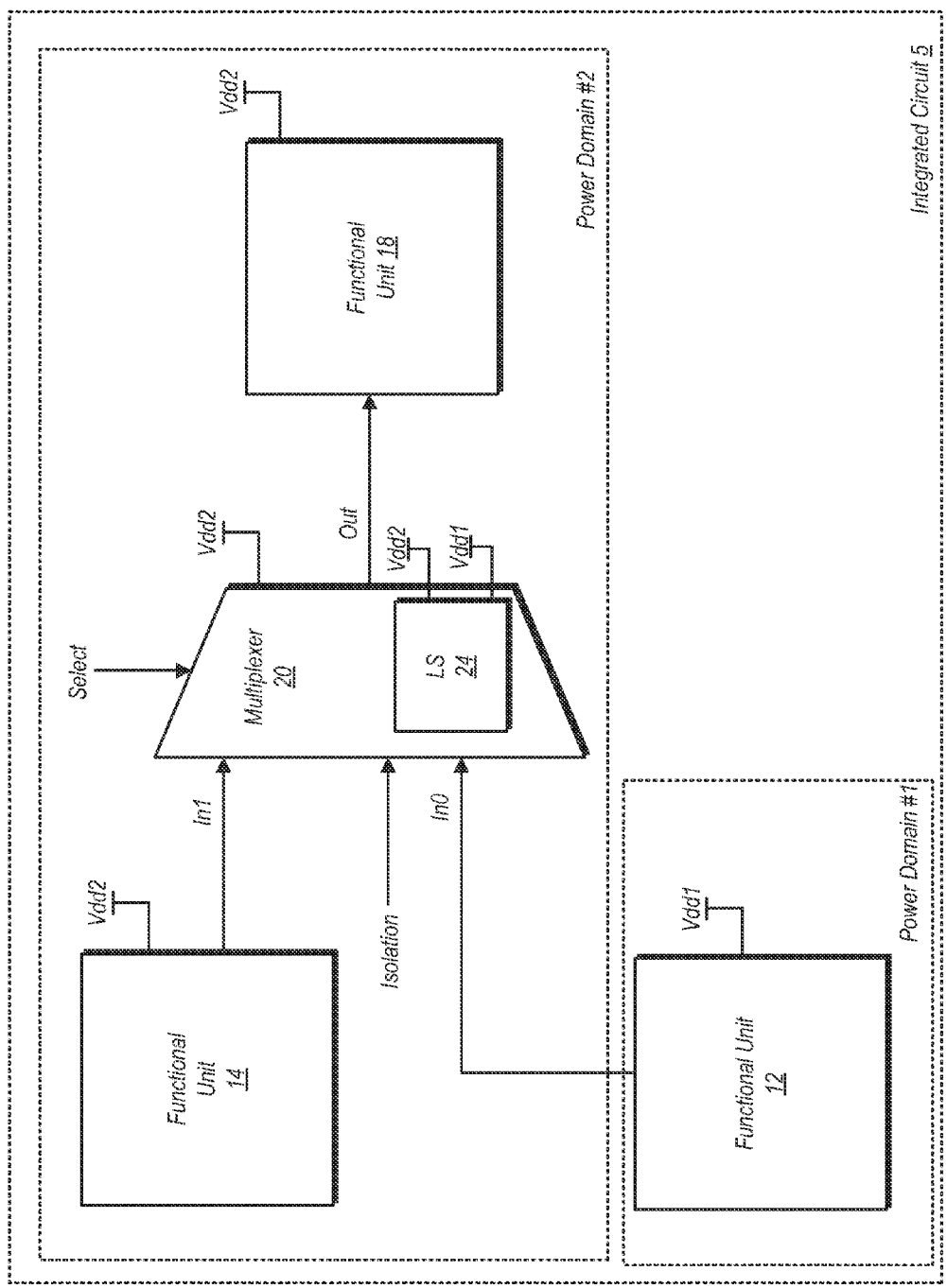
FIG. 1 is a block diagram of one embodiment of an integrated circuit (IC).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) is shown. In the embodiment shown, IC 5 includes at least two power domains, power domain #1 and power domain #2. Circuitry in power domain #1 may operate based on a supply voltage Vdd1. Circuitry in power domain #2 may operate based on a supply voltage Vdd2 that is different from Vdd1. Accordingly, the circuitry in the respective power domains may be configured for operation using different voltages.

In the embodiment shown in FIG. 1, power domain #1 includes a functional unit 12. Power domain #2 in the illustrated embodiment includes functional unit 14 and functional unit 18. Also included in the second power domain is multiplexer 20, which is coupled to receive a first input signal, In0, from functional unit 12 and a second input signal, In1, from functional unit 14. Multiplexer 20 is also configured to receive a select signal from circuitry within power domain #2. In one embodiment, the select signal may be provided by functional unit 14. In another embodiment, functional 18 may provide the select signal. In yet another embodiment, circuitry not explicitly shown in FIG. 1, but within power domain #2 may provide the selection signal. An output signal may be provided to functional unit 18 on the correspondingly labeled output node.

Since functional unit 12 is in a different power domain than functional unit 14, level shifting may be performed when In0 is selected. In the embodiment shown, multiplexer 20 includes a level shifter 24 coupled to receive supply voltages Vdd1 and Vdd2. Level shifter 24 may also receive In0 from functional unit 12. Thus, when In0 is selected, level shifter 24 may level shift the input signal received via In0 to produce a corresponding output signal in the second domain on the output node of multiplexer 20.

When In1 is selected, no level shifting is performed in this embodiment, since both In1 and the output node are coupled to convey signals in the same power domain, Power Domain #2 in this case.

In the embodiment shown, multiplexer 20 is also coupled to receive an isolation signal. The isolation signal may be used to isolate the signal received via In0 from the second power domain in certain circumstances. More particularly, assertion of the isolation signal in the embodiment shown causes level shifter 24 to be inhibited. Additional details will be provided further below.

Functional units 12, 14, and 18 may each be any type of functional unit. For example, functional unit 12 may be a functional unit such as a processor core in a processor voltage domain, while functional unit 14 is a timing circuit in the memory voltage domain, and functional unit 18 is a memory in the memory voltage domain. The signal provided by functional unit 12 may be a sense amplifier enable signal, while the signal provided by functional unit 14 may be a self-timing signal. However, this example is one of many possible examples, and is not intended to be limiting with regards to applications of multiplexer 20.

Figure 2:
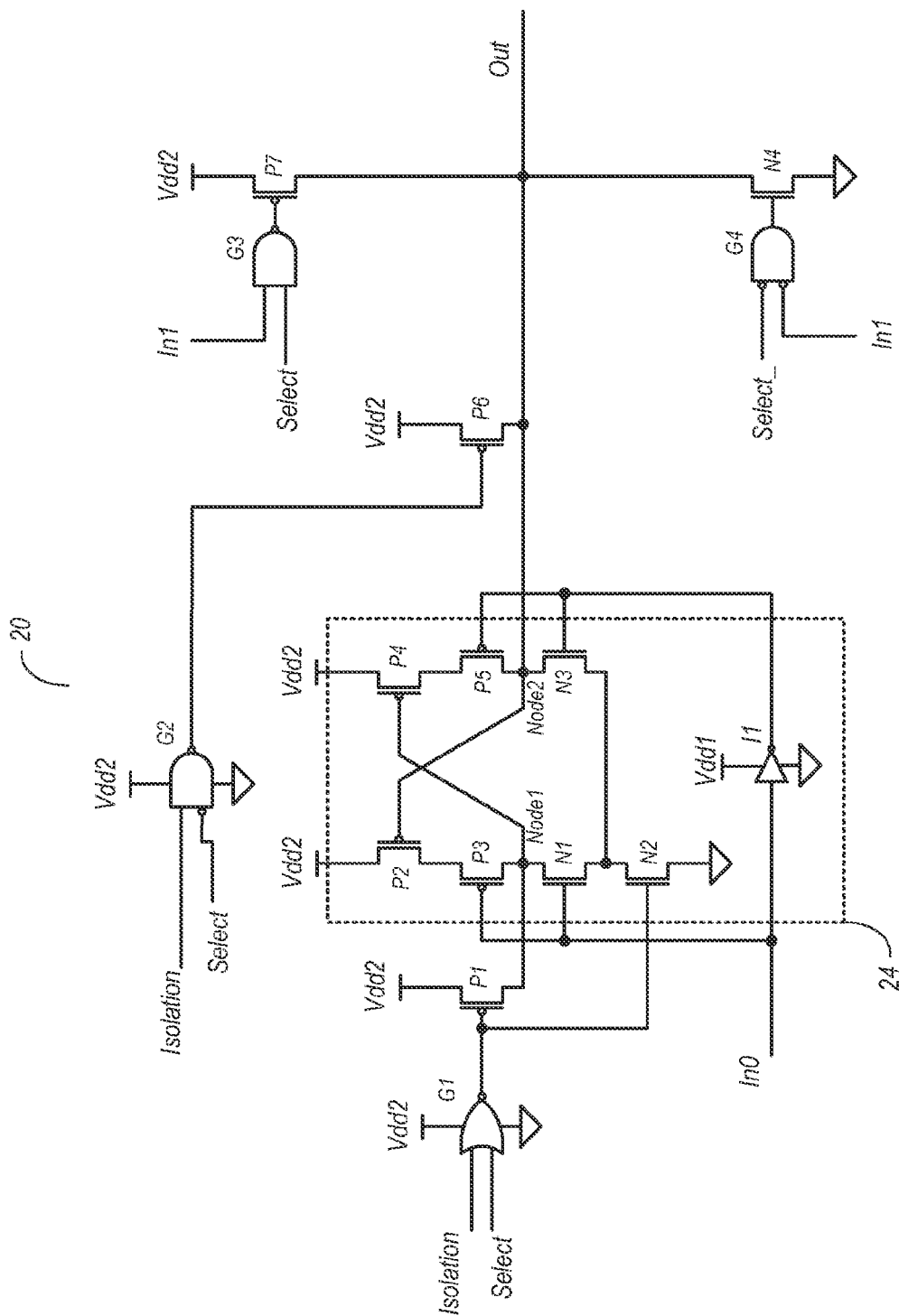
FIG. 2 is a schematic diagram of one embodiment of a multiplexer having level shifting capabilities for at least one input signal.

FIG. 2 is a schematic diagram of one embodiment of a multiplexer having level shifting capabilities for at least one input signal. In the embodiment shown, multiplexer 20 is configured to select between a signal received via the In0 input and the In1 input. The In0 input signal may be received from a voltage domain different from that from which the In1 input signal is received. In the embodiment shown, In0 is received from the voltage domain having an operating voltage of Vdd1, while In1 is received from the voltage domain having an operating voltage of Vdd2. Multiplexer 20 is also configured to provide an output signal into the voltage domain of Vdd2. Accordingly, if In0 is selected, level shifting may occur in level shifter 24. Otherwise, when In1 is selected, signal transfer may occur without level shifting.

In the embodiment shown, level shifter 24 includes an inverter I1 coupled to receive In0 and Vdd1. In0 is also coupled directly to a gate terminal of transistor N1, while the complement of In0 output from inverter I1 is coupled to the gate terminals of P5 and N3. When level shifter 24 is active, the output of NOR gate G1 is a logic high, which is received on the gate terminal of transistor N2. Accordingly, when level shifter 24 is active, a pull-down path is provided through either N1 and N2, or N3 and N2, depending on the state of In0. If In0 is high, a pull-down path is provided through N1 and N2. If In0 is low, a pull-down path is provided through N3 and N2.

NOR gate G1 in the embodiment shown if configured to output a logic 1 when both the select signal and the isolation signal are logic lows. When the select signal is low, In0 is the selected input. If In0 is high when In0 is the selected input, the pull-down path from Node 1 to ground (through N1 and N2) causes a logic low to be provided to the gate terminal of P4. Since the output of inverter I1 is low when In0 is high, transistor P5 is activated. Thus, when P4 and P5 are both active, a pull-up path is provided between Node 2 (also referred to as the output node) and Vdd2. Accordingly, level shifter 24 drives a logic high on the output node when In0 is high.

When In0 is low when it is the selected input, a pull-down path is provided between the output node and ground. The low on the output node causes the activation of P2, while P3 is active by virtue of the low on In0. Accordingly, a pull-up path is provided between Node 1 and Vdd2.

In the embodiment shown, multiplexer 20 includes isolation circuitry configured to inhibit level shifter 24 responsive to certain inputs. In this particular example, the isolation circuitry includes NOR gate G1 and transistor P1. NOR gate G1 is coupled to receive the isolation signal and the select signal. When both the isolation and select signals are logic low, NOR gate G1 outputs a logic high, and thus P1 is inactive and level shifter 24 is not inhibited. When In1 is selected, the output from NOR gate G1 is a logic low. Similarly, when the isolation signal is asserted as a logic high, the output of NOR gate G1 is a logic low. Thus, if either of these cases is true, the logic low output from NOR gate G2 is received on the gate terminal of P1, which is activated responsive thereto. The activation of P1 causes Node 1 to be pulled high, toward Vdd2. When Node 1 is pulled, high, transistor P4 is inhibited from activation. Transistor N2 is also inhibited from activation responsive to the low output from NOR gate G1. Accordingly, when NOR gate G1 outputs a logic low, level shifter 24 is inhibited from pulling the output node either high or low. Thus, level shifter 24 is inhibited from driving the output node responsive to NOR gate G1 outputting a logic low.

When the isolation signal is not asserted and the In1 is selected (i.e. the selection signal is a logic high, in this particular embodiment), one of transistors P7 or N4 drives the output node. If In1 is high when the selection signal is high, NAND gate G3 outputs a logic low to transistor P7, which is activated responsive thereto. When P7 is active, the output node is driven high into the voltage domain of Vdd2. When In1 is low while the select signal is high (and thus Select_is low), transistor N4 is active responsive to a logic high output by NOR gate G4. When active, transistor N4 drives the output node low.

In the embodiment shown of multiplexer 20, the circuitry for selecting and conveying In1 is essentially two transistors (P7 and N4) coupled in a wired-OR manner to the output node, which corresponding logic to drive the gate terminals of the added transistors. Thus, multiplexer 20 in this embodiment may be viewed as a level shifter with additional circuitry wired-OR coupled to the output. It is noted that the additional circuitry used to select In1 may be added without causing any substantial timing penalty to the operation of level shifter 24.

In the embodiment shown, multiplexer 20 includes an additional NAND gate G2, the output of which is coupled to the gate terminal of transistor P6. Transistor P6 is configured to drive the output node high when active. In the embodiment shown, NAND gate G2 is configured to drive its output low when In0 is selected (and thus the selection signal is low) while the isolation signal is asserted high. Thus, if level shifter 24 is to be inhibited while In0 is selected, the output node may be driven high to prevent unwanted noise that might otherwise occur thereon if left floating. It is noted however, that NAND gate G2 and transistor P6 are not required in all embodiments. For example, if other circuitry not explicitly shown here is coupled to drive the output node (e.g., if the output node is coupled to a bus), NAND gate G2 and transistor P6 may be eliminated, as other circuitry may prevent the output node from floating.

It is noted that the embodiment of multiplexer shown in FIGS. 1 and 2 is one possible embodiment of a multiplexer configured to receive signals from different voltage domains and output at least one of the input signals into another voltage domain. For example, embodiments are possible and contemplated wherein more than two inputs are provided to multiplexer, and wherein one or more of these inputs is in a different voltage domain than the output signal.

Figure 3:
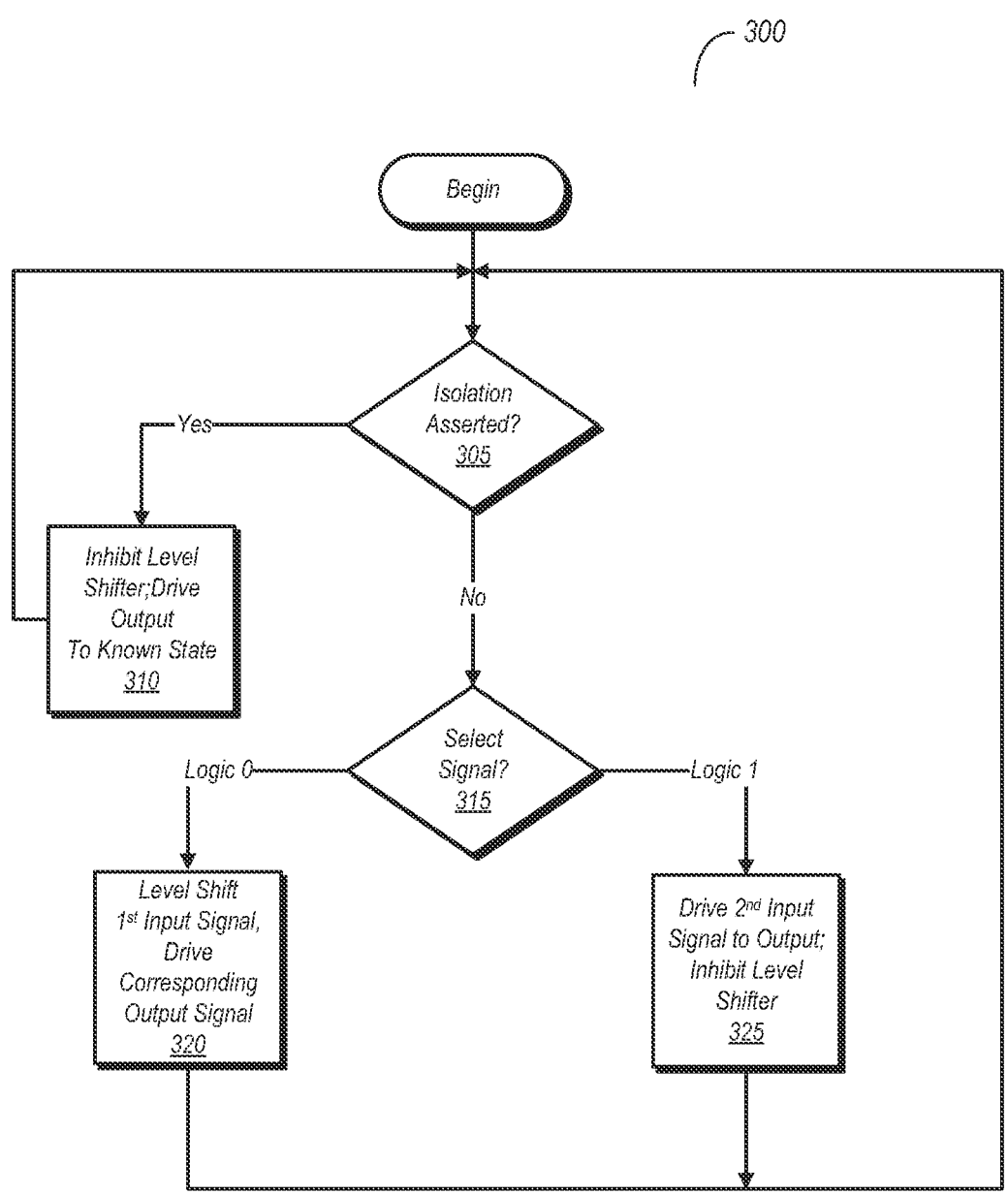
FIG. 3 is a flow diagram illustrating the operation of one embodiment of a level-shifting multiplexer.

FIG. 3 is a flow diagram illustrating the operation of one embodiment of a level-shifting multiplexer. Method 300 in the embodiment shown may be performed with the multiplexer 20 discussed above in relation to FIGS. 1 and 2, and may be performed with other embodiments of a multiplexer not explicitly shown or discussed herein.

If the isolation signal is asserted (block 305, yes), then the level shifter of the multiplexer may be inhibited, while its output may be driven to a known state. Driving the output to a known state may prevent the output node from floating and thus reduce its susceptibility to unwanted noise.

In one embodiment of a level shifting multiplexer, a select signal received as a logic 0 may be used to select an input coupled to receive a first input signal from a different voltage domain than the multiplexer output. In such an embodiment, when the select signal is a logic 0 (block 315, logic 0), then the first input signal is level shifted to cause the multiplexer to drive a corresponding output signal (block 320). In the same embodiment of the multiplexer, a select signal received as a logic 1 may select a second input signal received from the same voltage domain as the multiplexer output. Accordingly, if the select signal is a logic 1 (block 315, logic 1), then the second input signal is selected and the level shifter is inhibited (block 325). The output signal may be driven to a state corresponding to the state of the second input signal. Level shifting need not be performed in this case, since the second input is in the same voltage domain as the output.

Figure 4:
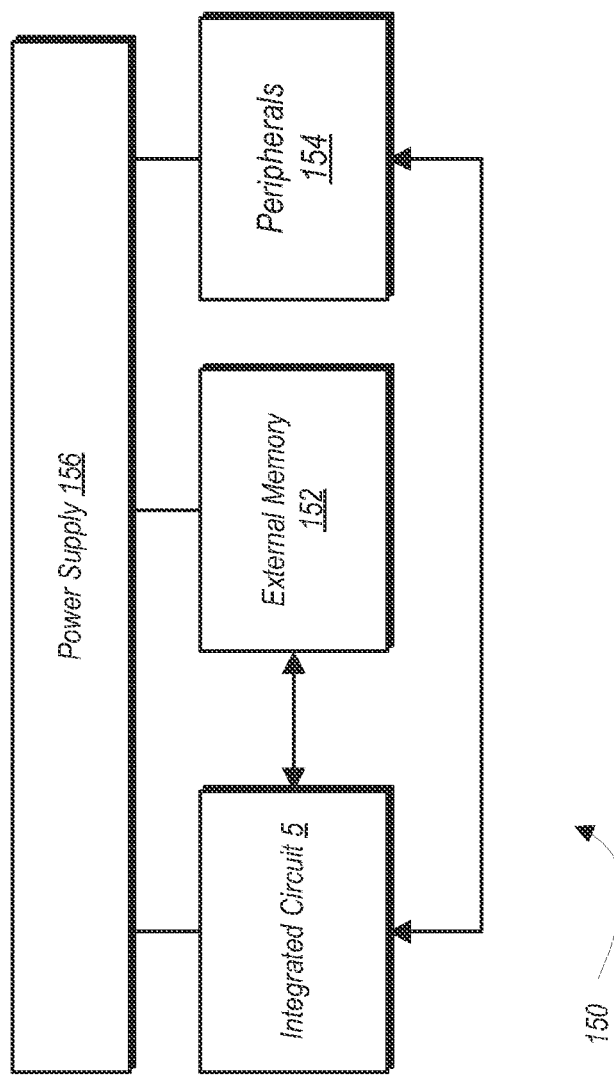
FIG. 4 is a block diagram of one embodiment of an exemplary system.

Turning next to FIG. 4, a block diagram of one embodiment of a system 150 is shown. In the illustrated embodiment, the system 150 includes at least one instance of the IC 5 coupled to external memory 152. IC 5 in the embodiment shown may be an IC that includes those features shown in FIG. 1. IC 5 is also coupled to one or more peripherals 154. A power supply 156 is also provided which supplies the supply voltages to the IC 5 as well as one or more supply voltages to the memory 152 and/or the peripherals 154. In some embodiments, more than one instance of the IC 5 may be included (and more than one external memory 152 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

Numerous variations and modifications will become apparent to those skilled in the art once the above disclosure is fully appreciated. It is intended that the following claims be interpreted to embrace all such variations and modifications.

What is claimed is:

1. An apparatus comprising:
   a level shifter circuit coupled between a first input node in a first voltage domain and an output node in a second voltage domain, wherein the level shifter circuit is configured to receive a first input signal on the first input node, wherein the level shifter is configured to drive an output signal corresponding to the first input signal on the output node responsive to a first state of a select signal;
   a first pull-up transistor configured to pull the output node up to an operating voltage of the second voltage domain responsive to a second state of the select signal and a first state of a second input signal;
   a pull-down transistor configured to pull the output node down to a ground voltage responsive to a second state of the select signal and a second state of the second input signal; and
   isolation circuitry coupled to receive an isolation signal, wherein the isolation circuitry is configured to inhibit the level shifter circuit from driving the output node when the isolation signal is asserted.

2. The apparatus as recited in claim 1, wherein the isolation circuitry is further coupled to receive the select signal, wherein the isolation circuitry is configured to inhibit the level shifter circuit from driving the output node when the select signal is in the second state.

3. The apparatus as recited in claim 1, further comprising a second pull-up transistor configured to pull the output node up to an operating voltage of the second voltage domain responsive to assertion of the isolation signal and the select signal being in the first state.

4. The apparatus as recited in claim 1, wherein the first input signal is generated in the first voltage domain, and wherein the second input signal, the isolation signal, and the select signal are each generated in the second voltage domain.

5. A method comprising:
   a multiplexer selecting a first signal received from a first functional unit operating in a first voltage domain;
   level shifting and outputting the first signal to a second functional unit operating in a second voltage domain;
   selecting, using the multiplexer, a second signal received from a third functional unit operating in the second voltage domain; and
   outputting the second signal to the second functional unit
   wherein the method further comprises:
      receiving a selection signal from a circuit operating in the second voltage domain;
      selecting, using the multiplexer, the first signal responsive to the selection signal being in a first state;
      selecting, using the multiplexer, the second signal responsive to the selection signal being in a second state;
      inhibiting level shifting of the first signal responsive to receiving an isolation signal; and
      inhibiting level shifting of the first signal responsive to receiving the selection signal in the second state.

6. The method as recited in claim 5, further comprising driving an output node of the multiplexer to a known state responsive to receiving the isolation signal and receiving the selection signal in the first state.

7. The method as recited in claim 5, further comprising:
   a pull-down transistor pulling an output node of the multiplexer down toward a ground voltage responsive to the second input signal being in the first state and the selection signal being in the second state; and a pull-up transistor pulling the output of the multiplexer up toward an operating voltage of the second voltage domain responsive to the second signal being in the second state and the selection signal being in the second state.

8. A circuit comprising:

a level shifter configured to receive a first input signal from a first voltage domain to provide an output signal in a second voltage domain;

a first transistor coupled to an output of the level shifter and configured to pull the output node up in response to a second input signal in the second voltage domain, wherein the output of the level shifter is in the second voltage domain;

a second transistor coupled to the output and configured to pull the node down in response to a second input signal; and an isolation circuit coupled to the level shifter, wherein the isolation circuit is configured to inhibit the level shifter circuit from providing the output signal in the second voltage domain responsive to receiving an isolation signal;

wherein the first transistor, the second transistor, and the level shifter are further controlled response to a select signal that selects between the first input signal and the second input signal.

9. The circuit as recited in claim 8, wherein the isolation signal is further configured to inhibit the level shifter circuit from providing the output signal in the second voltage domain responsive to the select signal being in a logic high state.

10. The circuit as recited in claim 8, wherein the first transistor is configured to pull the output node up responsive to the select signal being in a logic high state and the second input signal being in a logic high state.

11. The circuit as recited in claim 8, wherein the second transistor is configured to pull the output node down responsive to the select signal being in a logic high state and the second input signal being in a logic low state.

* * * * *

UNITED STATES PATENT AND TRADEMARK OFFICE
CERTIFICATE OF CORRECTION

PATENT NO.        : 8,558,603 B2                               Page 1 of 1
APPLICATION NO.   : 13/326932
DATED             : October 15, 2013
INVENTOR(S)       : Greg M. Hess et al.

It is certified that error appears in the above-identified patent and that said Letters Patent is hereby corrected as shown below:

In the Claims:

Claim 5, Column 6, lines 48-49, please delete "unit wherein" and substitute -- unit; wherein --

Signed and Sealed this
Eleventh Day of February, 2014

Michelle K. Lee
*Deputy Director of the United States Patent and Trademark Office*